(12) United States Patent
Kim et al.

(10) Patent No.: US 7,585,700 B2
(45) Date of Patent: Sep. 8, 2009

(54) BALL GRID ARRAY PACKAGE STACK

(75) Inventors: Jung-Jin Kim, Chungcheongnam-do (KR); Young-Hee Song, Kyunggi-do (KR); Dong-Ho Lee, Kyunggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 88 days.

(21) Appl. No.: 11/424,055

(22) Filed: Jun. 14, 2006

(65) Prior Publication Data

US 2006/0226543 A1 Oct. 12, 2006

Related U.S. Application Data

(62) Division of application No. 10/691,240, filed on Oct. 21, 2003, now Pat. No. 7,071,555.

(30) Foreign Application Priority Data

Mar. 5, 2003 (KR) .................. 2003-13676

(51) Int. Cl.
*H01L 21/44* (2006.01)
*H01L 21/48* (2006.01)

(52) U.S. Cl. .................. 438/109; 438/106; 438/110; 257/686

(58) Field of Classification Search .............. 438/106, 438/109–110; 257/686, E25.031–E25.032, 257/E23.042

See application file for complete search history.

(56) References Cited

U.S. PATENT DOCUMENTS 6,014,316 A * 1/2000 Eide .................. 361/735

(Continued)

FOREIGN PATENT DOCUMENTS

KR 2001-0011310 2/2001

(Continued)

OTHER PUBLICATIONS

English language abstract for Korean Publication No. 2001-0011310.

(Continued)

*Primary Examiner*—Theresa T Doan
(74) *Attorney, Agent, or Firm*—Marger Johnson & McCollom, P.C.

(57) ABSTRACT

Disclosed herein is a ball grid array (BGA) package stack that is not limited by ball arrangement because it utilizes a foldable circuit substrate, which permits interconnection between upper and lower individual BGA packages. The foldable circuit substrate has three portions. By bending the middle second portion, the foldable circuit substrate is folded in two. In the lower BGA package, an IC chip is attached on and electrically connected to a top surface of the first portion, and external connection terminals such as solder balls are formed on a bottom surface of the first portion. The top surface of the first portion is covered with a molding resin to protect the chip, and the third portion is placed on an upper surface of the molding resin. The upper BGA package is constructed in a similar manner to the lower BGA package as described above. For stacking, the interconnection terminals of the upper BGA package are joined and electrically connected to the third portion of the foldable circuit substrate of the lower BGA package.

6 Claims, 3 Drawing Sheets

U.S. PATENT DOCUMENTS

| | | |
|---|---|---|
| 6,576,493 B1 | 6/2003 | Lin et al. |
| 6,576,992 B1 | 6/2003 | Cady et al. |
| 6,765,288 B2 * | 7/2004 | Damberg .................. 257/698 |
| 7,246,431 B2 * | 7/2007 | Bang et al. .................. 29/835 |
| 2002/0044423 A1 | 4/2002 | Primavera et al. |
| 2003/0168725 A1 | 9/2003 | Warner et al. |

FOREIGN PATENT DOCUMENTS

| | | |
|---|---|---|
| KR | 2001-0078288 | 8/2001 |

OTHER PUBLICATIONS

English language abstract for Korean Publication No. 2001-0078288.

* cited by examiner

US 7,585,700 B2

BALL GRID ARRAY PACKAGE STACK

RELATED APPLICATION

This application is a Divisional of U.S. patent Ser. No. 10/691,240, filed on Oct. 21, 2003, now U.S. Pat. No. 7,071,555, which claims priority from Korean Patent Application No. 2003-13676 filed on Mar. 5, 2003, which are herein incorporated by reference in their entirety.

BACKGROUND OF THE INVENTION

1. Field of the Invention

The present invention relates to a semiconductor packaging technology, and more particularly, to a ball grid array (BGA) package stack in which at least two BGA packages are stacked and interconnected.

2. Description of the Related Art

In the semiconductor industry, packaging technology for semiconductor integrated circuit (IC) chips has been continuously developed to satisfy market demands for a smaller package size, a greater pin count, and a higher mounting density on the motherboard. Additionally, with the development of high speed and high performance electronic devices, BGA type packages, which are in some respects superior in electrical and thermal properties to conventional lead-frame type packages, have grown in market share.

Stacking technology, which is a kind of packaging technology, is used to mount more packages on motherboards with limited size. Thus, stacking technology, including package and chip stacking, serves to increase the number of packages or chips per unit area of the motherboard. BGA packages have, however, certain difficulties in adopting the stacking technology because of structural limitations. A conventional stack structure of a BGA package is shown in FIG. 1.

Referring to FIG. 1, two individual BGA packages 11 and 12 are stacked and interconnected to form a BGA package stack 10. Stacking and interconnecting between the individual BGA packages 11 and 12 are made by solder balls 15. The solder balls 15 are formed under a circuit substrate 13 of an upper package 11 and joined onto a circuit substrate 14 of a lower package 12. Therefore, to effectively stack the BGA packages 11 and 12, the solder balls 15 should be located outside of a chip region 17. In other words, contrary to typical independent BGA packages, the BGA package 11 and 12 used for the conventional BGA stack 10 does not allow the solder balls 15 to be arranged evenly over a bottom surface thereof. As a result, the stacked BGA package becomes much greater in size than the chip due to the limits of ball arrangement. This makes the conventional BGA stack structure inapplicable to certain smaller type package such as certain chip size package (CSP). In addition, the solder ball 15 should have a large enough size to maintain a space between the upper and lower individual packages 11 and 12.

SUMMARY OF THE INVENTION

The present invention provides a ball grid array (BGA) package stack, which is not limited by a ball arrangement, thereby enabling a smaller package size, a greater pin count and a higher mounting density. The BGA package stack according to the present invention includes a foldable circuit substrate permitting interconnection between upper and lower individual BGA packages. In particular, the foldable circuit substrate is included in a lower BGA package.

The foldable circuit substrate of the lower BGA package can have three portions. In this configuration, a first integrated circuit (IC) chip is attached on and electrically connected to a top surface of a first portion of the substrate. A first molding resin covers the top surface of the first portion to protect the first IC chip, and external connection terminals are formed on a bottom surface of the first portion. A third portion of the substrate is placed on an upper face of the molding resin.

The upper BGA package includes a circuit substrate, a second IC chip attached on and electrically connected to a top surface of the circuit substrate, and a second molding resin covering the top surface of the circuit substrate. The upper BGA package further includes interconnection terminals formed on a bottom surface of the circuit substrate. The interconnection terminals are joined and electrically connected to the third portion of the foldable circuit substrate of the lower BGA package.

In the BGA package stack of the present invention, the external connection terminals may be distributed over the bottom surface of the first portion of the foldable circuit substrate, and the interconnection terminals may be distributed over the bottom surface of the circuit substrate. The external connection terminals and the interconnection terminals may further be solder balls.

In addition, each BGA package may further include metal wires for electrically connecting the chip and the circuit substrate. The foldable circuit substrate may have first ball pads formed in the first portion to receive the external connection terminals, second ball pads formed in the third portion to receive the interconnection terminals, and connection lines connecting the first and second ball pads. Further, the foldable circuit substrate may have a base layer and a coating layer. The connection lines are formed on the base layer and covered with the coating layer. The ball pads are formed on the base layer and exposed through pad openings of the coating layer. The external connection terminals may be formed on the first ball pads through the pad openings, and the interconnection terminals may be joined to the second ball pads through the pad openings.

DETAILED DESCRIPTION OF THE INVENTION

The present invention will be now described more fully hereinafter with reference to the accompanying drawings. This invention may, however, be embodied in many different forms and should not be construed as limited to the embodiment set forth herein; rather, this embodiment is provided so that this disclosure will be thorough and complete, and will fully convey the scope of the invention to those skilled in the art. For purposes of illustration, some elements are exaggerated, outlined, or omitted in drawings. Further, in general the same reference numbers represent same elements.

Figure 1:
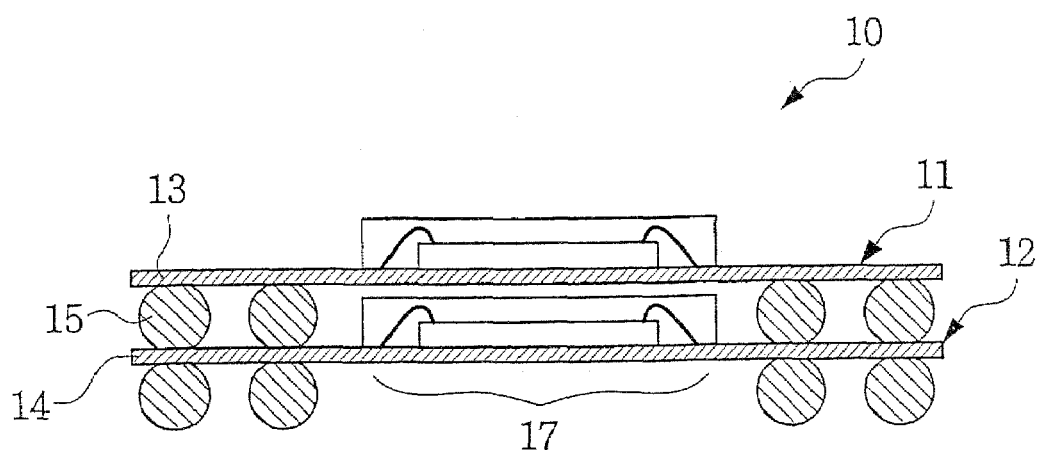
FIG. 1 is a diagram of a cross-sectional view showing a conventional BGA package stack.
Figure 2:
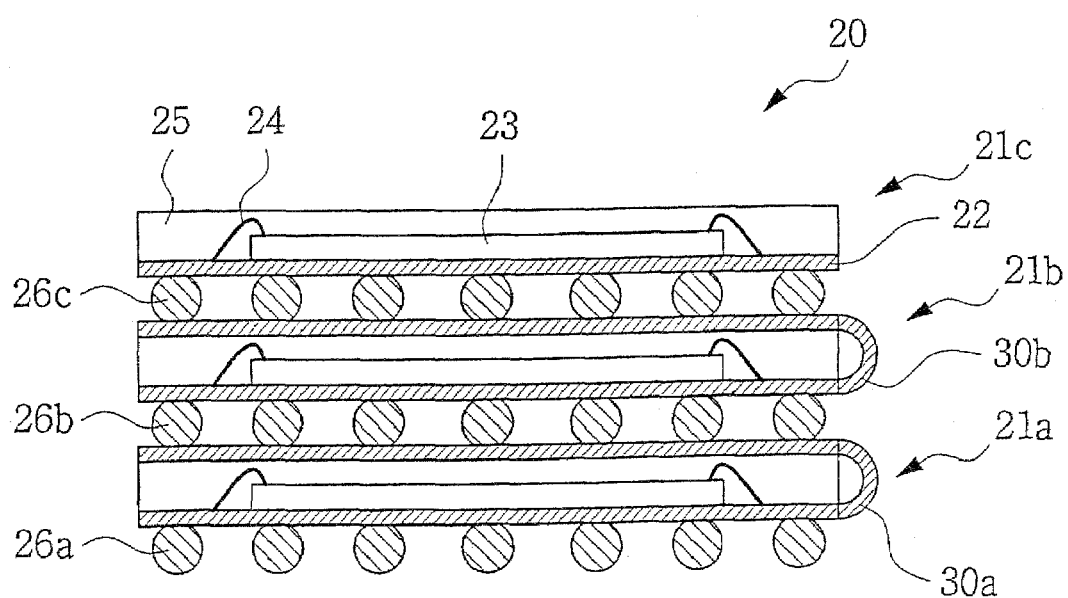
FIG. 2 is a diagram of a cross-sectional view showing a BGA package stack according to one embodiment of the present invention.

FIG. 2 is a diagram of a cross-sectional view of a BGA package stack 20 according to an embodiment of the present invention. Referring to FIG. 2, the package stack 20 includes at least two individual BGA packages, shown here by three individual packages 21a, 21b, and 21c, which will be hereinafter referred to as a lower package 21a, a middle package 21b, and an upper package 21c, respectively. Each individual package 21a, 21b, and 21c has a circuit substrate 30a, 30b, and 22. As will be discussed below, a flexible (i.e., foldable) circuit substrate can be employed as the respective circuit substrates 30a and 30b of the lower and middle packages 21a and 21b. However, the circuit substrate 22 of the upper package 21c can be a printed circuit board or a flexible circuit substrate.

An integrated circuit (IC) chip 23 is attached with adhesive (not shown) on a top surface of each circuit substrate 30a, 30b, and 22. Metal wires 24, such as gold wires, electrically connect a top surface of the IC chip 23 and the top surface of the circuit substrate 30a, 30b, and 22. A molding resin 25 such as epoxy compound covers the top surface of the circuit substrate 30a, 30b, and 22 to protect the IC chip 23 and the metal wires 24. Solder balls 26a, 26b, and 26c are arranged on a bottom surface of each circuit substrate 30a, 30b, and 22. Like a typical BGA package, the solder balls 26a, 26b, and 26c of the package stack 20 are distributed over the bottom surface of the circuit substrate without limiting the ball arrangement. The solder balls 26b and 26c of the middle and upper packages 21b and 21c act as interconnection terminals between the individual BGA packages. However, the solder balls 26a of the lower package 21a act as the package stack's 20 external connection terminals. The solder balls 26a, 26b, and 26c may be made out of metal.

The circuit substrate 30a of the lower package 21a is folded in two and attached with adhesive (not shown) to an upper face of the molding resin that is, in turn, attached to an upper surface of the lower part of the folded substrate 30a. The solder balls 26b of the middle package 21b are joined to the circuit substrate 30a of the lower package 21a. Similarly, the circuit substrate 30b of the middle package 21b is folded in two and attached to an upper face of the molding resin on the upper surface of its lower substrate 30b. The solder balls 26c of the upper package 21c are joined to the circuit substrate 30b of the middle package 21b. That is, the foldable circuit substrates 30a and 30b permit the stacking of the BGA packages 21a, 21b, and 21c without a ball arrangement limitation. The foldable circuit substrates 30a and 30b will be described in more detail herein.

Figure 3:
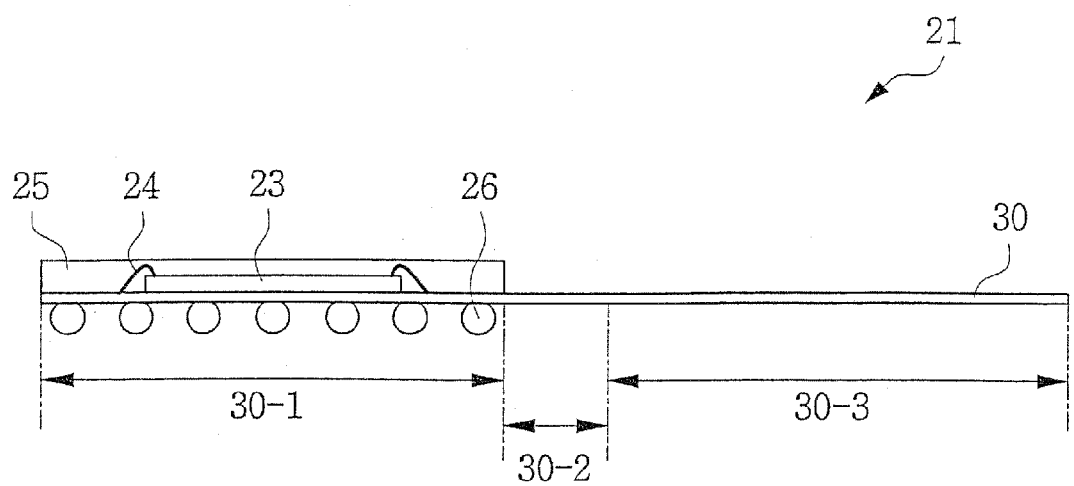
FIG. 3 is a diagram of a cross-sectional view showing an individual BGA package used for the BGA package stack shown in FIG. 2.

Before stacking, the individual BGA package 21 has a structure shown in FIG. 3. The individual BGA package 21 in FIG. 3 corresponds to the lower and the middle packages 21a and 21b in FIG. 2. The foldable circuit substrate 30 of the BGA package 21 is longer than that of a typical BGA package. For the sake of convenience, the foldable circuit substrate 30 will be divided into three portions, namely, a first portion 30-1, a second portion 30-2, and a third portion 30-3. The first portion 30-1 of the circuit substrate 30 corresponds to a circuit substrate of the typical BGA package. Therefore, the IC chip 23 and the molding resin 25 are formed on the top surface of the first portion 30-1, and the solder balls 26 are formed on the bottom surface of the first portion 30-1. The second portion 30-2 is especially flexible and bendable, so the circuit substrate 30 can be folded in two. The third portion 30-3 has nearly the same size as the first portion 30-1. When the circuit substrate 30 is folded, the third portion 30-3 is placed on the upper face of the molding resin 25. Therefore, the bottom surface of the third portion 30-3 now faces upward.

Figure 4:
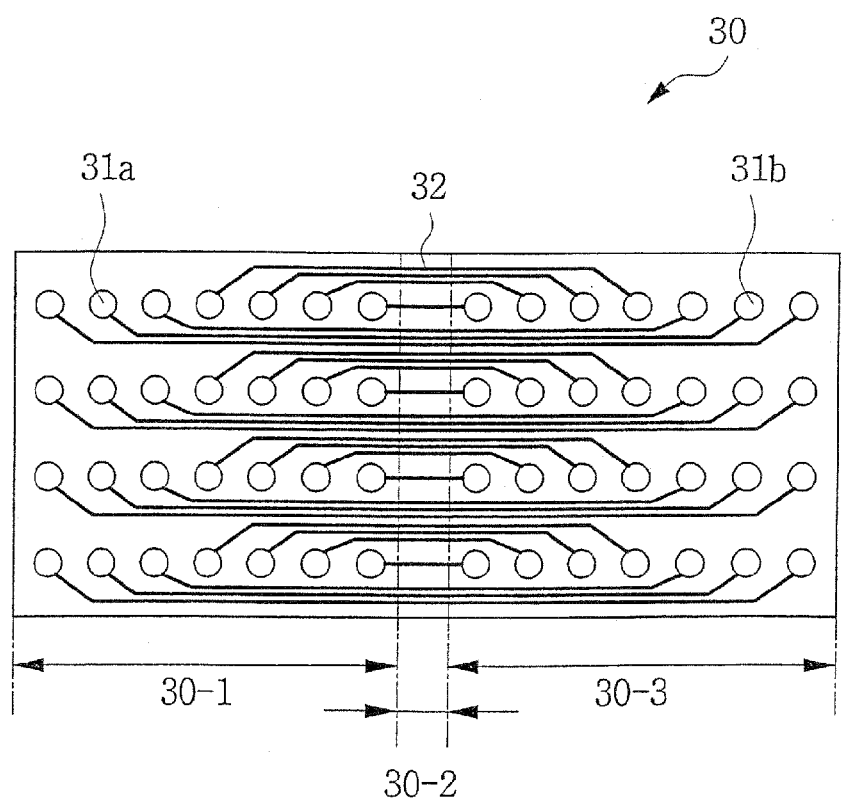
FIG. 4 is a diagram of a plan view showing a circuit substrate of the individual BGA package shown in FIG. 3.

FIG. 4 shows, in a diagram of a plan view, the bottom surface of the circuit substrate 30 shown in FIG. 3. As shown in FIG. 4, the circuit substrate 30 includes a plurality of ball pads 31a and 31b, and a plurality of connection lines 32. The ball pads 31a and 31b are formed in the first and the third portions 30-1 and 30-3 of the substrate 30. The second portion 30-2 does not have ball pads. The ball pads formed in the first portion 30-1 will be referred to as first ball pads 31a, and the ball pads formed in the third portion 30-3 will be referred to as second ball pads 31b. The first ball pads 31a are respectively connected to the second ball pads 31b through the connection lines 32.

Figure 5:
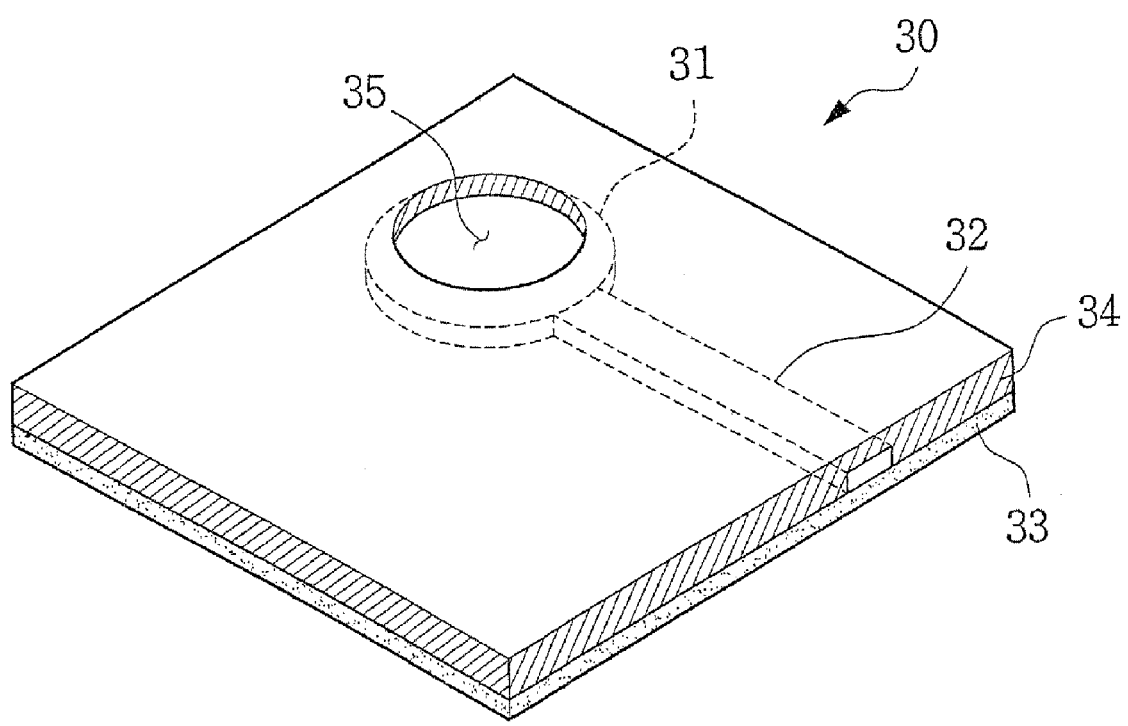
FIG. 5 is a diagram of a partially enlarged perspective view of the circuit substrate shown in FIG. 4.

FIG. 5 depicts, in a diagram of a partially enlarged perspective view, a detailed structure of the circuit substrate 30 shown in FIG. 4. As shown in FIG. 5, the circuit substrate 30 is composed of a base layer 33 and a coating layer 34. The ball pad 31 and the connection line 32 are formed on the base layer 33 and covered with the coating layer 34. The coating layer 34 not only prevents short circuits between adjacent ball pads 31 or adjacent connection lines 32, but also prevents the pads 31 and lines 32 from being exposed to contamination or oxidation. A pad opening 35 is a region where the coating layer 34 is partly removed and the ball pad 31 is mostly exposed to receive the solder ball.

Referring to FIGS. 3, 4, and 5 together, a manufacturing process of the BGA package stack using the foldable circuit substrate will be described hereinafter. From the description of the process, the structure of the package stack will also be clear. The IC chip 23 is attached to the top surface of the first portion 30-1 of the circuit substrate 30 and electrically connected thereto by metal wires 24. The top surface of the first portion 30-1 is then covered with the molding resin 25. The solder balls 26 are formed on the bottom surface of the first portion 30-1, particularly at the first ball pads 31a through the pad opening 35. Before mounting the solder balls 26 on the first ball pads 31a, flux is applied to the first ball pads 31a to facilitate the re-flowing of solder.

Thereafter, the second portion 30-2 of the circuit substrate 30 is bent toward the side face of the molding resin 25, and the third portion 30-3 is also bent toward the upper face of the molding resin 25. The third portion 30-3 of the circuit substrate 30 is then attached to the upper face of the molding resin 25. Therefore, the second ball pads 31b face upward to receive the solder balls of another individual package to be stacked on the current package.

After the fabrication of the individual packages is completed, one individual package is placed onto another individual package for stacking. At this time, the solder balls of an upper individual package are mounted on the second ball pads of a lower individual package and then joined by re-flowing the solder. The package stack is continuously manufactured in this manner until the desired number of stacked packages is achieved.

As described above, the BGA package stack of the present invention does not have a ball arrangement limitation because it utilizes a foldable circuit substrate. Accordingly, the BGA package stack of the present invention can provide a smaller package size, a greater pin count, and a higher mounting density. Additionally, no other stacking medium besides the solder balls is required and the size of the solder ball can be reduced.

In the drawings and specification, an embodiment of the present invention has been disclosed, and although specific terms are employed, they are used in a generic and descriptive sense only and not for purposes of limitation; the scope of the invention being set forth in the following claims.

What is claimed is:

1. A method for manufacturing a ball grid array package stack, the method comprising:

forming a lower ball grid package that has a foldable circuit substrate with a first substrate portion, a second substrate portion, and a third substrate portion, comprising:

positioning an integrated circuit chip on a top surface of the first substrate portion and electrically connecting the circuit chip to a plurality of first ball pads positioned on a bottom surface of the first substrate portion;

applying a molding resin to cover the first substrate portion and the integrated circuit chip;

bending the second substrate portion so that the third substrate portion is positioned on a top surface of the molding resin, a top surface of the third substrate portion comprising a plurality of second ball pads;

forming an upper ball grid package that includes a second integrated circuit positioned on a top substrate;

forming balls on the plurality of ball pads on the bottom surface of the top substrate; and positioning the upper ball grid package on the lower ball grid package so that the balls on the bottom surface of the upper ball grid package are aligned with the top ball pads on the top surface of the third substrate portion of the lower ball grid package, wherein each of the plurality of first ball pads is electrically connected to a corresponding one of the plurality of second ball pads by a connection line.

2. The method of claim 1, further comprising applying flux to the first ball pads located on the bottom surface of the upper ball grid package and the second ball pads located on the top surface of the third substrate portion before forming the balls on the ball pads.

3. The method of claim 1, wherein the balls between the upper and lower ball grid packages are solder balls.

4. The method of claim 1, further comprising reflowing the solder on the balls between the upper and lower ball grid packages so that these two packages are joined.

5. The method of claim 1, wherein the integrated circuits are electrically connected to the circuit substrate with metal wires.

6. A method for manufacturing a ball grid array package stack, the method comprising:

forming a lower ball grid package that has a foldable circuit substrate with a first substrate portion, a second substrate portion, and a third substrate portion, comprising:

positioning an integrated circuit chip on a top surface of the first substrate portion and electrically connecting the circuit chip to a plurality of first ball pads positioned on a bottom surface of the first substrate portion;

applying a molding resin to cover the first substrate portion and the integrated circuit chip;

bending the second substrate portion so that the third substrate portion is positioned on a top surface of the molding resin, a top surface of the third substrate portion comprising a plurality of second ball pads;

forming an upper ball grid package that includes a second integrated circuit positioned on a top substrate;

forming balls on the plurality of ball pads on the bottom surface of the top substrate; and positioning the upper ball grid package on the lower ball grid package so that the balls on the bottom surface of the upper ball grid package are aligned with the top ball pads on the top surface of the third substrate portion of the lower ball grid package, wherein each of the plurality of first ball pads is electrically connected to a corresponding one of the plurality of second ball pads by a connection line, and wherein the circuit substrate comprises:

a plurality of ball pads and a plurality of connection lines, the ball pads and the connection lines both being formed on a base layer;

a coating layer, the coating layer covering the base layer and the connection lines; and a plurality of pad openings, the pad openings formed by partially removing the coating layer and exposing the ball pads.

* * * * *